United States Patent
Hata et al.

(10) Patent No.: US 9,219,203 B2
(45) Date of Patent: Dec. 22, 2015

(54) LIGHT EMITTING APPARATUS AND ILLUMINATING APPARATUS

(71) Applicant: SHARP KABUSHIKI KAISHA, Osaka-shi, Osaka (JP)

(72) Inventors: Toshio Hata, Osaka (JP); Shinya Ishizaki, Osaka (JP); Makoto Matsuda, Osaka (JP)

(73) Assignee: SHARP KABUSHIKI KAISHA, Osaka-shi, Osaka (JP)

( * ) Notice: Subject to any disclaimer, the term of this patent is extended or adjusted under 35 U.S.C. 154(b) by 0 days.

(21) Appl. No.: 14/384,430

(22) PCT Filed: Feb. 14, 2013

(86) PCT No.: PCT/JP2013/053477
§ 371 (c)(1),
(2) Date: Sep. 11, 2014

(87) PCT Pub. No.: WO2013/136899
PCT Pub. Date: Sep. 19, 2013

(65) Prior Publication Data
US 2015/0102369 A1    Apr. 16, 2015

(30) Foreign Application Priority Data
Mar. 14, 2012 (JP) .................. 2012-057924

(51) Int. Cl.
*H01L 33/50* (2010.01)
*H01L 33/48* (2010.01)
*H01L 25/075* (2006.01)
(Continued)

(52) U.S. Cl.
CPC .......... *H01L 33/504* (2013.01); *H01L 25/0753* (2013.01); *H01L 27/156* (2013.01); *H01L 33/48* (2013.01); *H01L 33/50* (2013.01); *H01L 33/502* (2013.01); *H01L 33/507* (2013.01); *H01L 33/508* (2013.01); *H01L 33/56* (2013.01); *H01L 2924/0002* (2013.01)

(58) Field of Classification Search
CPC ....... H01L 33/48; H01L 33/50; H01L 33/502; H01L 33/504; H01L 33/508
See application file for complete search history.

(56) References Cited

U.S. PATENT DOCUMENTS

2005/0212397 A1 * 9/2005 Murazaki et al. ............. 313/487
2008/0211421 A1   9/2008 Lee et al.
2009/0027883 A1   1/2009 Koike et al.
(Continued)

FOREIGN PATENT DOCUMENTS

CN    101140715 A *  3/2008
JP    2000-164935     6/2000
(Continued)

OTHER PUBLICATIONS

Extended European Search Report mailed Mar. 24, 2015 in EP Patent Application 13760692.7.
(Continued)

*Primary Examiner* — Eduardo A Rodela
(74) *Attorney, Agent, or Firm* — Nixon & Vanderhye, P.C.

(57) ABSTRACT

A light emitting device (1) of the present invention is a light emitting device including a light emitting section (3) provided on a substrate (2), light storing phosphors (7) being provided on or above at least a part of the substrate (2). It is therefore possible to provide a planar light emitting device having a light storage function.

14 Claims, 12 Drawing Sheets

(51) Int. Cl.
*H01L 27/15* (2006.01)
*H01L 33/56* (2010.01)

(56) References Cited

U.S. PATENT DOCUMENTS

| | | |
|---|---|---|
| 2010/0044735 A1 | 2/2010 | Oyamada |
| 2010/0141172 A1* | 6/2010 | Uchida et al. ............... 315/294 |
| 2010/0320483 A1* | 12/2010 | Kadotani et al. ............. 257/88 |
| 2011/0069256 A1 | 3/2011 | Ohkubo |
| 2013/0009553 A1 | 1/2013 | Lee |

FOREIGN PATENT DOCUMENTS

| | | |
|---|---|---|
| JP | 2001-100682 | 4/2001 |
| JP | 2005-101023 | 4/2005 |
| JP | 2005-330459 | 12/2005 |
| JP | 2007-234632 | 9/2007 |
| JP | 2007-304588 | 11/2007 |
| JP | 2008-191321 | 8/2008 |
| JP | 2008-544569 A | 12/2008 |
| JP | 2010-278099 A | 12/2010 |
| JP | 2011-071221 | 4/2011 |
| JP | 2011-108742 | 6/2011 |
| WO | 2007/001116 A1 | 1/2007 |
| WO | 2007/052777 A1 | 5/2007 |

OTHER PUBLICATIONS

International Search Report for PCT/JP2013/053477, mailed Apr. 16, 2013.
Written Opinion of the ISA (foreign language) for PCT/JP2013/053477, mailed Apr. 16, 2013.
Japanese Office Action mailed Aug. 18, 2015 in JP application 2012-057924.

* cited by examiner

LIGHT EMITTING APPARATUS AND ILLUMINATING APPARATUS

This application is the U.S. national phase of International Application No. PCT/JP2013/053477 filed 14 Feb. 2013 which designated the U.S. and claims priority to JP Patent Application No. 2012-057924 filed 14 Mar. 2012, the entire contents of each of which are hereby incorporated by reference.

TECHNICAL FIELD

The present invention relates to a light emitting device which emits light, particularly, a light emitting device which employs a light storing phosphor.

BACKGROUND ART

A light emitting device, in which a light emitting diode or the like is employed as a light source and a light storing phosphor is provided near the light source, has been known as a conventional technique. According to such a light emitting device, even in a case where the light source stops emitting light, the light storing phosphor can continue to emit.

Patent Literature 1 discloses a display that (i) employs, as a pixel for displaying an image, a light storing phosphor light emitting element and (ii) is capable of continuing to emit light in a desired luminescent color even after a light emitting diode stops emitting light. Note that the light storing phosphor light emitting element is obtained by combining (a) a light emitting diode that emits light in a near ultraviolet region or a visible light region and (b) a light storing phosphor that is capable of instantaneously emitting light upon being excited by light emitted from the light emitting diode. This allows a function, as a display, to be maintained even in a case where the light emitting element, having the light emitting diode, stops emitting light due to some reason.

Patent Literature 2 discloses an illuminating apparatus that includes (i) an LED package having an LED and a phosphor which is arranged so as to cover the LED and (ii) a reflector having a reflective surface for reflecting light emitted from each of the LED and the phosphor, wherein a part in which a light storing material is arranged and a part in which no light storing material is arranged are provided on the reflective surface of the reflector. This allows the illuminating apparatus to (i) irradiate auxiliary light while the LED is being turned off and (ii) reduce a possibility that light reflected from the reflective surface of the reflector is weakened while the LED is being turned on.

Patent Literature 3 discloses a fluorescent substance including (i) a first fluorescent substance which converts at least a part of energy of an excitation source and has a first emission spectrum different from that of such converted energy and (ii) a second fluorescent substance which converts at least a part of the first emission spectrum and has a second emission spectrum different from the first emission spectrum, wherein the first fluorescent substance is a light storing fluorescent substance. It is therefore possible to provide (i) a fluorescent substance which has an extremely wide luminescent chromaticity range and is capable of emitting afterglow having a high luminance and (ii) a lamp including the fluorescent substance.

Patent Literature 4 discloses a light emitter in which a light storing material is incorporated into an optical system of an LED, the light storing material is excited by ultraviolet region energy of the LED, and the light storing material is used as a secondary light source. This allows self-luminous visible light to be obtained without using electric power dedicated for exciting the light storing material, thereby ultimately improving an efficiency of the light emitter.

Patent Literature 5 discloses a light emitting diode that is made up of (i) a light emitting diode chip, (ii) a transparent member which is provided near the light emitting diode chip and transmits light emitted from the light emitting diode chip, and (iii) light storing fluorescent agent particles which are dispersed in the transparent member. This allows, by use of light emitting of stored light, a reduction in electric current consumption during light emitting, and ultimately allows a power-saving light emitting diode to be realized.

CITATION LIST

Patent Literatures

Patent Literature 1
Japanese Patent Application Publication, Tokukai, No. 2007-304588 A (Publication Date: Nov. 22, 2007)
Patent Literature 2
Japanese Patent Application Publication, Tokukai, No. 2007-234632 A (Publication Date: Sep. 13, 2007)
Patent Literature 3
Japanese Patent Application Publication, Tokukai, No. 2005-330459 A (Publication Date: Dec. 2, 2005)
Patent Literature 4
Japanese Patent Application Publication, Tokukai, No. 2005-101023 A (Publication Date: Apr. 14, 2005)
Patent Literature 5
Japanese Patent Application Publication, Tokukai, No. 2000-164935 A (Publication Date: Jun. 16, 2000)

SUMMARY OF INVENTION

Technical Problem

The conventional techniques described above are each arranged such that a light storing phosphor is employed in a dot-shaped light emitting device. Note, however, that it has been expected that a planar light emitting device is also equipped with a light storage function.

The present invention has been made in order to address the problems, and an object of the present invention is to provide a planner light emitting device having a light storage function.

Solution to Problem

In order to attain the object, a light emitting device of one aspect of the present invention is a light emitting device including: a light emitting section provided on a substrate, light storing phosphors being provided on or above at least a part of the substrate.

With the arrangement, since the light storing phosphors are provided on the at least a part of the substrate, even in a case where the light emitting section stops emitting light, the light storing phosphors emit light for a while. As such, the light emitting device can maintain a function as a light source. It is therefore possible to provide a planar light emitting device having a light storage function.

Advantageous Effects of Invention

As has been described, a light emitting device of one aspect of the present invention is a light emitting device including: a planner light emitting section provided on a substrate, light storing phosphors being provided on or above at least a part of the substrate. This brings about an effect of providing a planar light emitting device having a light storage function.

DESCRIPTION OF EMBODIMENTS

Embodiment 1

Figure 1:
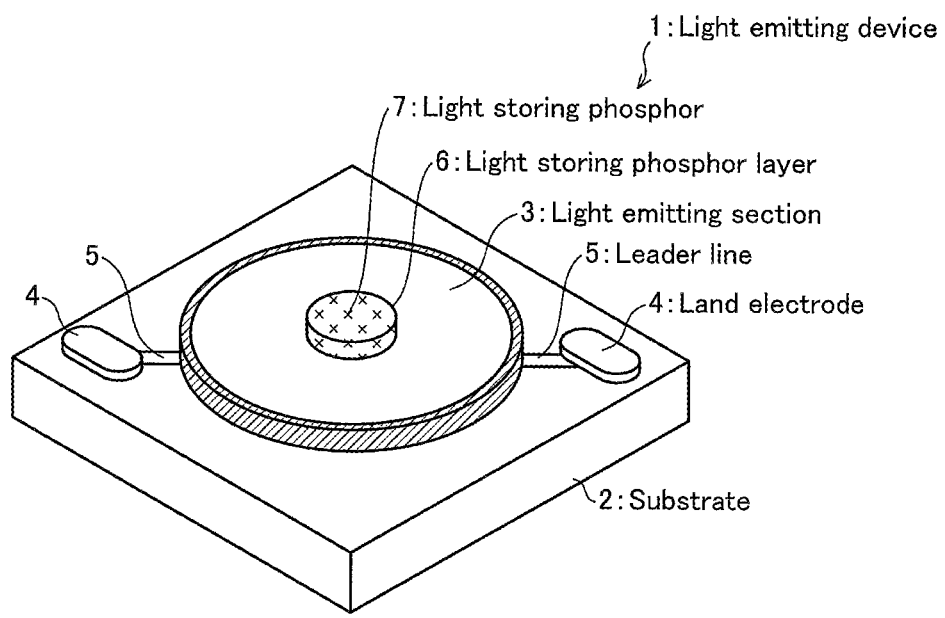
FIG. 1 is a perspective view illustrating an arrangement of a light emitting device of Embodiment 1 of the present invention.
Figure 2:
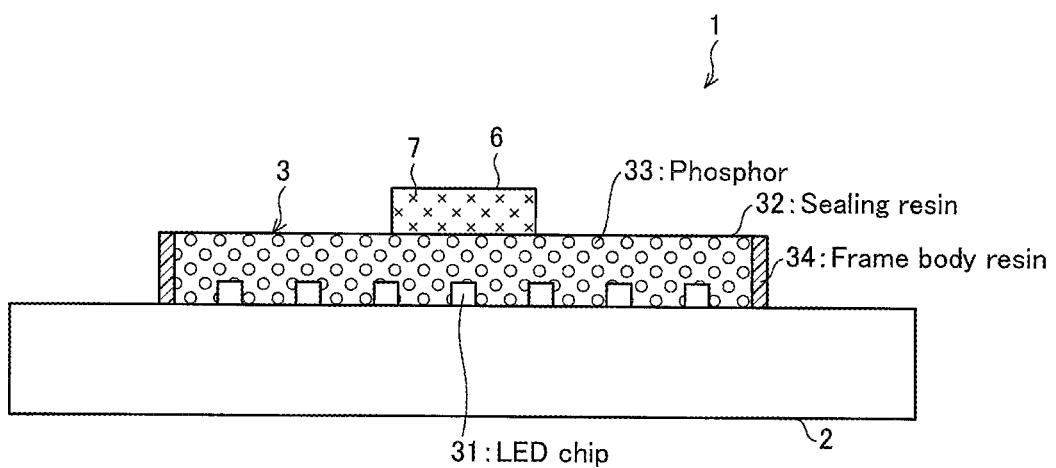
FIG. 2 is a cross sectional view illustrating the arrangement of the light emitting device of Embodiment 1 of the present invention.

The following description will discuss Embodiment 1 of the present invention with reference to FIGS. 1 and 2.

(Arrangement of Light Emitting Device 1)

FIG. 1 is a perspective view illustrating an arrangement of a light emitting device 1 of Embodiment 1. FIG. 2 is a cross sectional view illustrating the arrangement of the light emitting device 1.

The light emitting device 1 includes a substrate 2, a light emitting section 3, land electrodes 4, leader lines 5, and a light storing phosphor layer 6 (see FIG. 1). The light emitting device 1 is a kind of light emitting device of what is called a CHIP on Board (COB) type and has the light emitting section 3 provided in a planar manner on the substrate 2.

The light emitting section 3 includes LED chips (light emitting elements) 31, a sealing resin 32, phosphors 33, and a frame body resin 34 (see FIG. 2). The LED chips 31 are provided in a matrix manner on the substrate 2 and are connected to each other via a wiring pattern (not shown) provided on the substrate 2.

The sealing resin 32 is a light transmittance resin with which the LED chips 31 and the phosphors 33 are sealed. The phosphors 33 are excited by light emitted from the LED chips 31 so as to emit light in a given color. This causes light emitted from the light emitting section 3 to be in a color in which a color of the light emitted from the LED chips 31 and a color of the light excited from the phosphors 33 are mixed. Note that the light emitting section 3 can be arranged such that the sealing resin 32 includes no phosphor 33, depending on the color of the light emitted from the light emitting section 3.

The frame body resin 34 is provided on an outer circumference of the sealing resin 32 when viewed from above, and functions as a resin dam which defines a region to be sealed with the sealing resin 32. The frame body resin 34 is provided in a circular shape (see FIG. 1). Note, however, that the shape of the frame body resin 34 is not limited to a specific one and can therefore be, for example, a rectangular shape.

The land electrodes 4 are provided for supplying electric power to the LED chips 31, and the land electrodes 4 are arranged so as to face each other via the light emitting section 3. The leader lines 5 are provided for connecting the LED chips 31 and the land electrodes 4.

(Arrangement of Light Storing Phosphor Layer 6)

In the light emitting device 1, the light storing phosphor layer 6 is further provided on a surface (on a surface from which light is emitted) of the light emitting section 3 (see FIG. 1). The light storing phosphor layer 6 contains therein a plurality of light storing phosphors 7. The light storing phosphor layer 6 allows the plurality of light storing phosphors 7 to emit light for a while (for a time period ranging from dozens of seconds to a few minutes), even in a case where the light emitting section 3 stops emitting light due to, for example, a stoppage of electric power supply from the land electrodes 4. This allows the light emitting device 1 to be employed as an emergency illuminating apparatus.

The light storing phosphor layer 6 has a disk shape and is smaller than the light emitting section 3. That is, a cross section of the light storing phosphor layer 6 is provided so as to protrude from a surface of the light emitting section 3 (see FIG. 2). This allows a reduction in light blocked by the light storing phosphor layer 6 while the light emitting device 1 is normally being turned on.

Note that, although, in FIG. 1, the light storing phosphor layer 6 is provided in a center of the surface of the light emitting section 3, a position where the light storing phosphor layer 6 is provided is not particularly limited, provided that the light storing phosphor layer 6 is formed on the surface of the light emitting section 3.

It is preferable that the light storing phosphors 7 be sealed with a thixotropic resin. This facilitates providing the light storing phosphor layer 6 and makes it difficult for the light storing phosphor layer 6 to lose shape.

In a process of producing the light emitting device 1, the frame body resin 34 is formed so as to surround the LED chips 31, and then the sealing resin 32, in which the phosphors 33 are mixed, is injected inside of the frame body resin 34 so as to form the light emitting section 3. Thereafter, the light storing phosphor layer 6 is formed on the surface of the light emitting section 3.

Note that examples of the light storing phosphor 7 encompass strontium aluminate ($SrAl_2O_4$:Eu,Dy; emitting light of 520 nm), $Sr_4Al_{14}O_{25}$:Eu,Dy (emitting light of 500 nm), CaS: Eu,Tm (luminescent color: red), ZnS:Cu,Mn,Co (luminescent color: yellowish orange), ZnS:Cu (luminescent color: yellowish green), and (Ca,Sr)S:Bi (luminescent color: bluish purple). Alternatively, a material having a luminescent color such as yellow green, blue, or purple can be employed as the light storing phosphor 7.

Embodiment 2

The following description will discuss Embodiment 2 of the present invention with reference to FIGS. 3 through 6. For convenience, members which have functions identical with those in Embodiment 1 are given identical reference numerals, and will not be described repeatedly.

(Arrangement of Light Emitting Device 1*a*)

Figure 3:
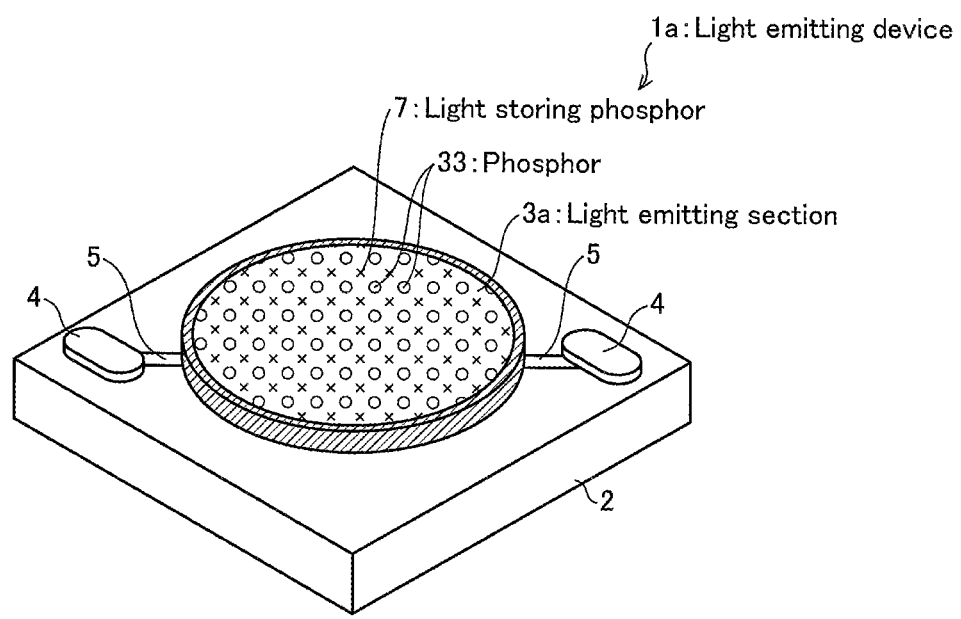
FIG. 3 is a perspective view illustrating an arrangement of a light emitting device of Embodiment 2 of the present invention.
Figure 4:
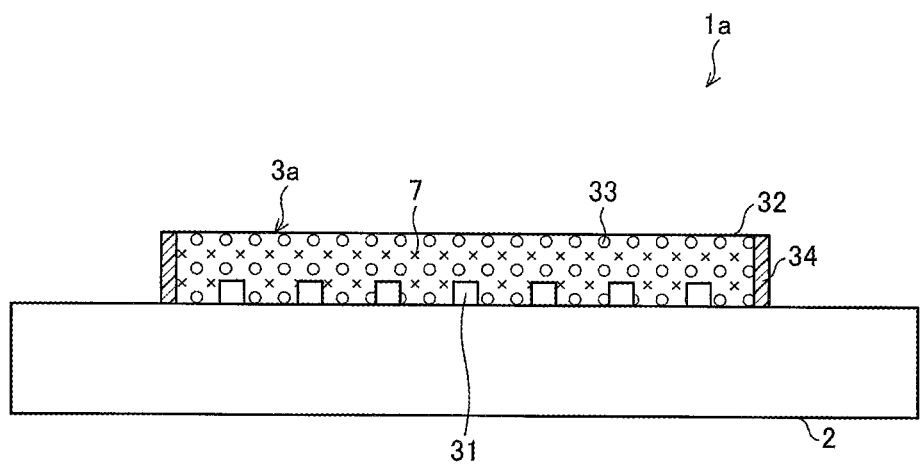
FIG. 4 is a cross sectional view illustrating the arrangement of the light emitting device of Embodiment 2 of the present invention.

FIG. 3 is a perspective view illustrating an arrangement of a light emitting device 1*a* of Embodiment 2. FIG. 4 is a cross sectional view illustrating the arrangement of the light emitting device 1*a*.

The light emitting device 1*a* includes a substrate 2, a light emitting section 3*a*, land electrodes 4, and leader lines 5 (see FIG. 3). That is, the light emitting device 1*a* is arranged such that, in the light emitting device 1 of Embodiment 1, the light emitting section 3 is replaced with the light emitting section 3*a* and the light storing phosphor layer 6 is omitted.

The light emitting section 3*a* includes LED chips 31, a sealing resin 32, phosphors 33, a frame body resin 34, and light storing phosphors 7 (see FIG. 4). That is, the light emitting section 3*a* is arranged such that, in the light emitting section 3 of Embodiment 1, the light storing phosphors 7 are further mixed in the sealing resin 32.

This allows the light storing phosphors 7 to emit light for a while, even in a case where the LED chips 31 stop emitting light. This allows the light emitting device 1*a* to be employed as an emergency illuminating apparatus.

(Variation)

According to the light emitting device 1*a*, the light storing phosphors 7 are uniformly dispersed in the sealing resin 32. This causes a reduction in luminous efficiency of the light emitting section 3*a* while the light emitting section 3*a* is normally being turned on. In view of the circumstances, the following description will discuss an arrangement which suppresses such a reduction in luminous efficiency while the light emitting section is normally being turned on.

Figure 5:
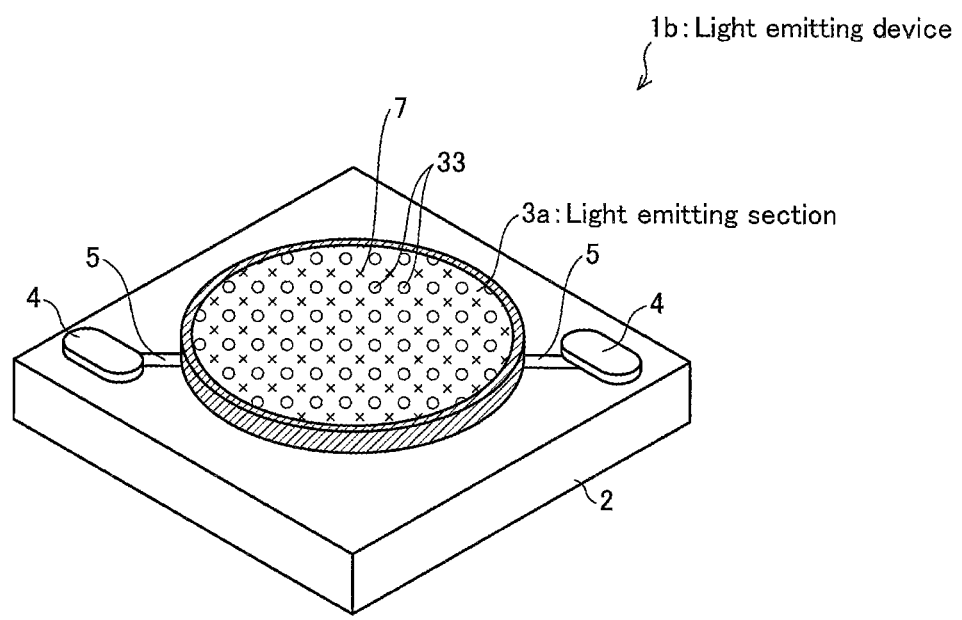
FIG. 5 is a perspective view illustrating an arrangement of a light emitting device of a variation of Embodiment 2 of the present invention.
Figure 6:
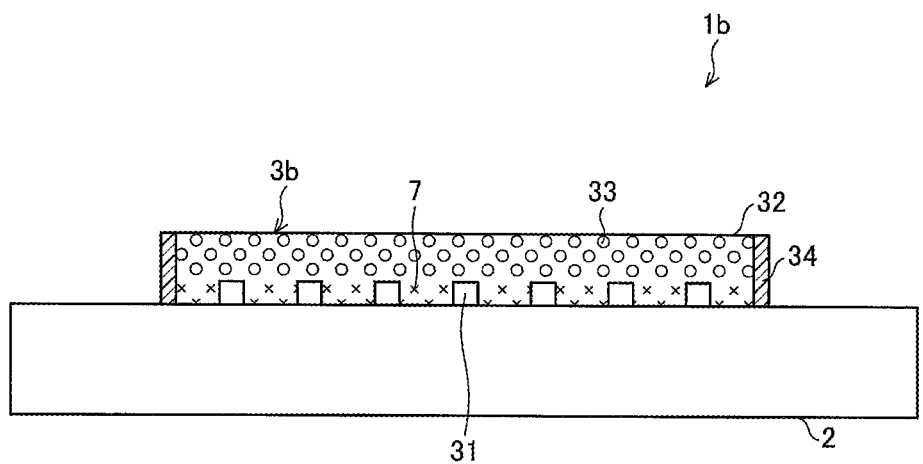
FIG. 6 is a cross sectional view illustrating the arrangement of the light emitting device of the variation of Embodiment 2 of the present invention.

FIG. 5 is a perspective view illustrating an arrangement of a light emitting device 1*b* of a variation of Embodiment 2. FIG. 6 is a cross sectional view illustrating the arrangement of the light emitting device 1*b*.

The light emitting device 1*b* includes a substrate 2, a light emitting section 3*b*, land electrodes 4, and leader lines 5 (see FIG. 5). That is, the light emitting device 1*b* is arranged such that, in the light emitting device 1*a* illustrated in FIG. 3, the light emitting section 3*a* is replaced with the light emitting section 3*b*.

As with the light emitting section 3*a* illustrated in FIG. 4, the light emitting section 3*b* includes LED chips 31, a sealing resin 32, phosphors 33, a frame body resin 34, and light storing phosphors 7, (see FIG. 6). Note, however, that, according to the light emitting section 3*b*, the light storing phosphors 7 are settled down in a bottom part of the sealing resin 32 and are therefore hardly present on a surface side of the light emitting section 3*b*, unlike the light emitting section 3*a*.

The light storing phosphors 7 are thus disproportionately distributed on a side of the substrate 2, rather than the surface side of the light emitting section 3*b*. Accordingly, the light storing phosphors 7 hardly block light emitted from the LED chips 31 while the light emitting section 3*b* is normally being turned on. This suppresses a reduction in luminous efficiency of the light emitting device 1*a* while the light emitting device 1*a* is normally being turned on.

In a process of forming the light emitting section 3*b*, the light storing phosphors 7 is caused to settle down in the sealing resin 32 in a state in which the sealing resin 32 has a thin viscosity. Thereafter, the phosphors 33 are dispersed in the sealing resin 32 in a state in which the sealing resin 32 has a thick viscosity. In this case, the phosphors 33 will not settle down in the bottom part of the sealing resin 32.

Embodiment 3

The following description will discuss Embodiment 3 of the present invention with reference to FIGS. 7 through 10. For convenience, members which have functions identical with those in each of Embodiments 1 and 2 are given identical reference numerals, and will not be described repeatedly.

(Arrangement of Light Emitting Device 1*c*)

Figure 7:
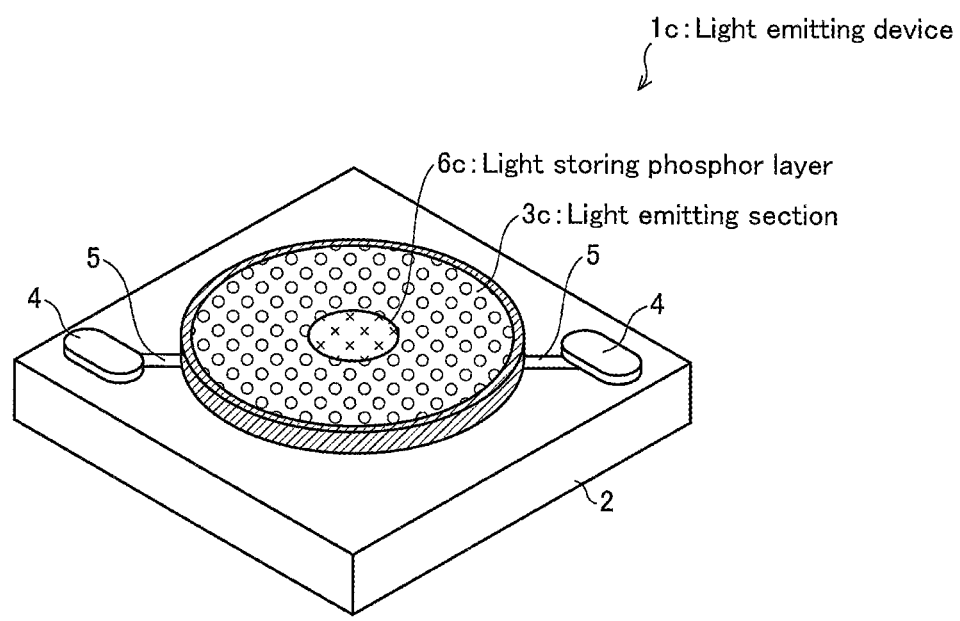
FIG. 7 is a perspective view illustrating an arrangement of a light emitting device of Embodiment 3 of the present invention.
Figure 8:
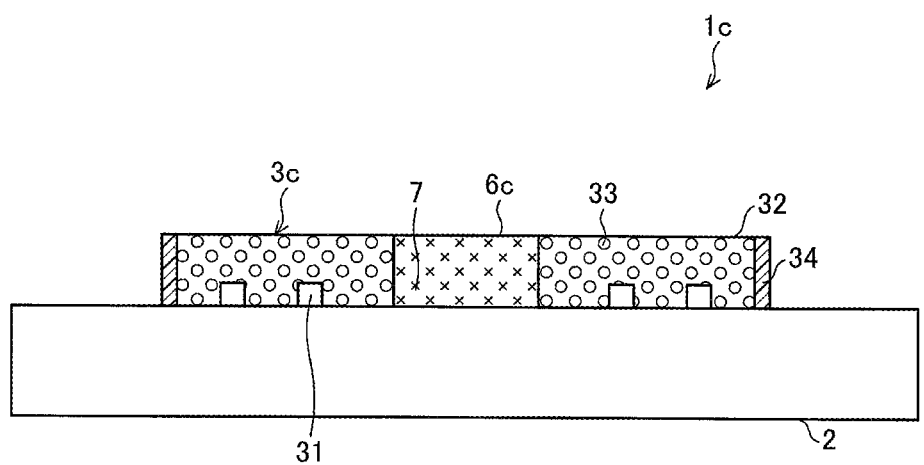
FIG. 8 is a cross sectional view illustrating the arrangement of the light emitting device of Embodiment 3 of the present invention.

FIG. 7 is a perspective view illustrating an arrangement of a light emitting device 1*c* of Embodiment 3. FIG. 8 is a cross sectional view illustrating the arrangement of the light emitting device 1*c*.

The light emitting device 1*c* includes a substrate 2, a light emitting section 3*c*, land electrodes 4, leader lines 5, and a light storing phosphor layer 6*c* (see FIG. 7). That is, the light emitting device 1*c* is arranged such that, in the light emitting device 1 of Embodiment 1, the light emitting section 3 and the light storing phosphor layer 6 are replaced with the light emitting section 3*c* and the light storing phosphor layer 6*c*, respectively. As with the light storing phosphor layer 6, the light storing phosphor layer 6*c* contains therein a plurality of light storing phosphors 7.

The light emitting section 3*c* includes LED chips 31, a sealing resin 32, phosphors 33, and a frame body resin 34 (see FIG. 8). An opening part is provided in a center part of the light emitting section 3*c*, in which opening part the light storing phosphor layer 6*c* is fitted. In other words, the light storing phosphor layer 6*c* provided on the substrate 2 is surrounded by the sealing resin 32.

In this case, the frame body resin 34 and the light storing phosphor layer 6*c* are each formed by use of a thixotropic resin, and then the sealing resin 32 is injected between the frame body resin 34 and the light storing phosphor layer 6*c* so that the light emitting section 3*c* is formed. It is preferable that the light emitting section 3*c* be formed by kneading the light storing phosphors 7 in the sealing resin 32. This suppresses, while the light emitting device 1*c* is normally being turned on, a reduction in luminance of a range in which the light storing phosphor layer 6*c* has been formed.

(Variation 1)

According to the light emitting device 1*c*, the light storing phosphor layer 6*c* is in contact with the sealing resin 32. On the other hand, the following description will discuss an arrangement in which a light storing phosphor layer is separated from a sealing resin.

Figure 9:
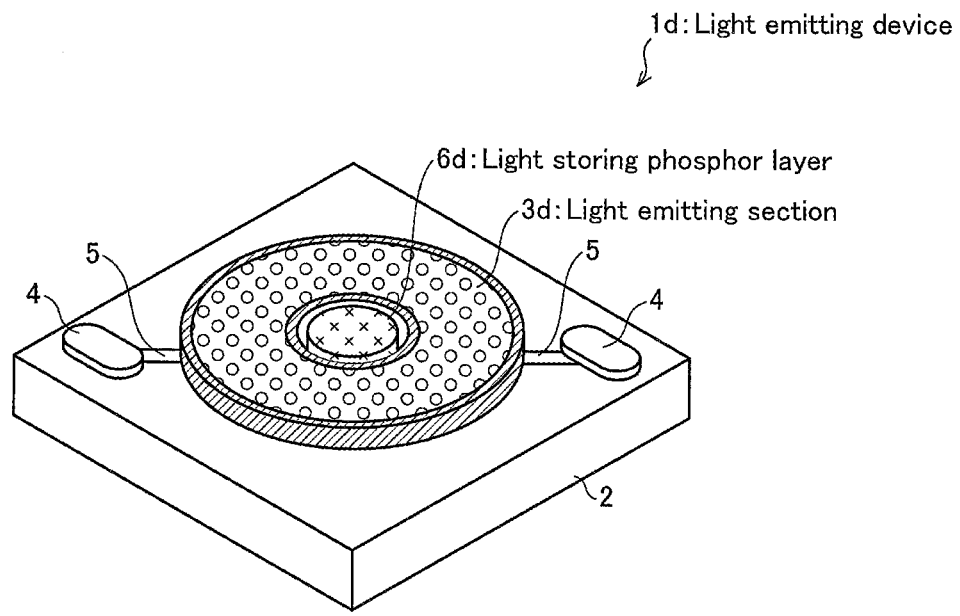
FIG. 9 is a perspective view illustrating an arrangement of a light emitting device of a variation of Embodiment 3 of the present invention.
Figure 10:
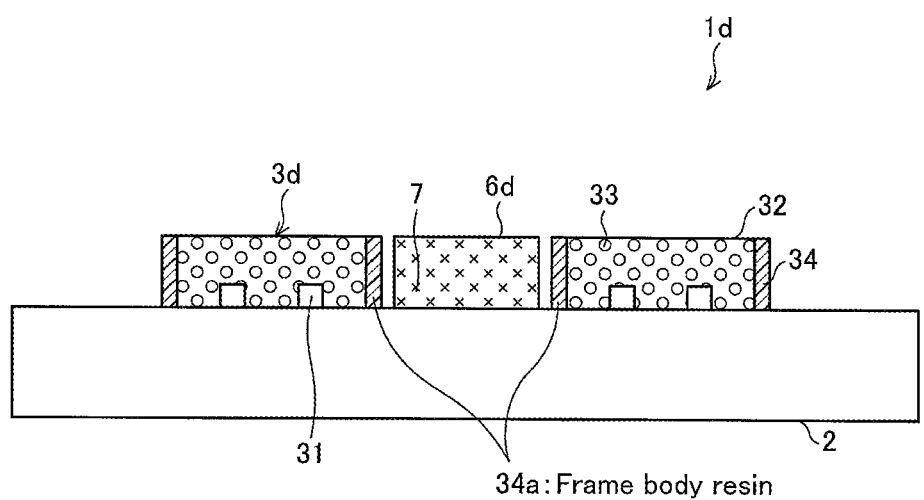
FIG. 10 is a cross sectional view illustrating the arrangement of the light emitting device of the variation of Embodiment 3 of the present invention.

FIG. 9 is a perspective view illustrating an arrangement of a light emitting device 1d of a variation of Embodiment 3. FIG. 10 is a cross sectional view illustrating the arrangement of the light emitting device 1d.

The light emitting device 1d includes a substrate 2, a light emitting section 3d, land electrodes 4, leader lines 5, and a light storing phosphor layer 6d (see FIG. 9). That is, the light emitting device 1d is arranged such that, in the light emitting device 1c illustrated in each of FIGS. 7 and 8, the light emitting section 3c and the light storing phosphor layer 6 are replaced with the light emitting section 3d and the light storing phosphor layer 6d, respectively. As with the light storing phosphor layers 6 and 6c, the light storing phosphor layer 6d contains therein a plurality of light storing phosphors 7.

The light emitting section 3d includes LED chips 31, a sealing resin 32, phosphors 33, a frame body resin 34, and a frame body resin 34a (see FIG. 10). As with the frame body resin 34, the frame body resin 34a (i) is a resin dam which has a circular shape and defines a region to be sealed with the sealing resin 32 and (ii) is provided on an internal circumference of the sealing resin 32. The light storing phosphor layer 6d is provided inside of the frame body resin 34a.

With the arrangement, it is possible that the light storing phosphor layer 6d is formed after the light emitting section 3d is formed. Alternatively, it is possible that the light emitting section 3d is formed after the light storing phosphor layer 6d is formed. The light emitting device 1d thus has a greater degree of freedom in a production process as compared with the light emitting device 1c.

(Variation 2)

In the light emitting devices 1c and 1d, luminance in regions in which the respective light storing phosphor layers 6c and 6d are provided is easily reduced while the light emitting devices 1c and 1d are normally being turned on. In view of the circumstances, Variation 2 will deal with an arrangement in which a light storing phosphor layer is further provided between a light emitting section and a substrate so as to suppress a reduction in luminance of a region in which the light storing phosphor layer is provided.

Figure 11:
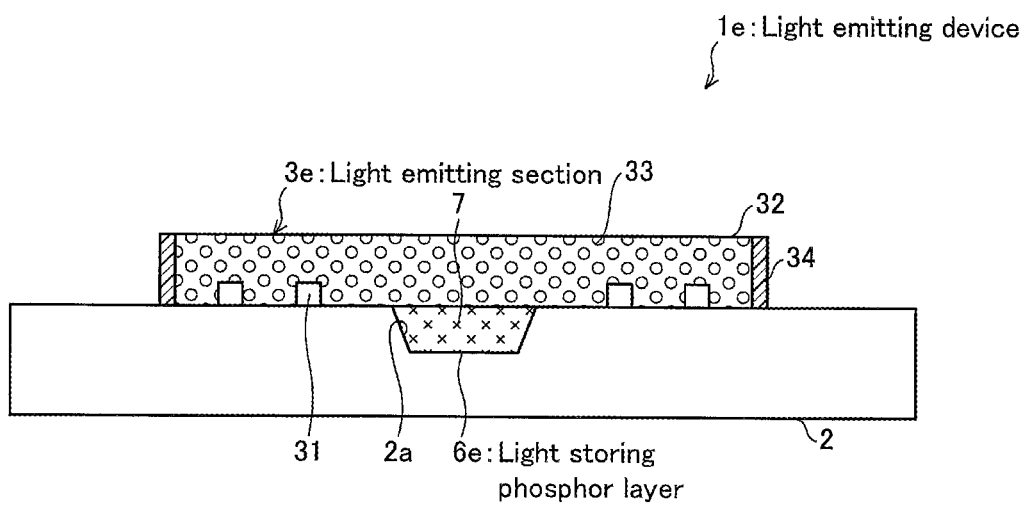
FIG. 11 is a cross sectional view illustrating an arrangement of a light emitting device of another variation of Embodiment 3 of the present invention.

FIG. 11 is a cross sectional view illustrating an arrangement of a light emitting device 1e of another variation of Embodiment 3. The light emitting device 1e includes a substrate 2, a light emitting section 3e, land electrodes 4, leader lines 5, and a light storing phosphor layer 6e. As with the light storing phosphor layers 6, 6c, and 6d, the light storing phosphor layer 6e contains therein a plurality of light storing phosphors 7.

A concave part 2a is provided in a part of the substrate 2, and the light storing phosphor layer 6e is provided so as to be filled in the concave part 2a (see FIG. 11). The light emitting section 3e includes LED chips 31, a sealing resin 32, phosphors 33, and a frame body resin 34 and is provided on the substrate 2 including a region in which the light storing phosphor layer 6e is provided.

As described above, the light storing phosphor layer 6e is filled in the concave part 2a of the substrate 2 and the light emitting section 3e is provided on the light storing phosphor layer 6e. Accordingly, the light storing phosphors 7 contained in the light storing phosphor layer 6e never block light emitted from the light emitting section 3e. This suppresses a reduction in luminance of a range in which the light storing phosphor layer 6e is provided.

Embodiment 4

Figure 12:
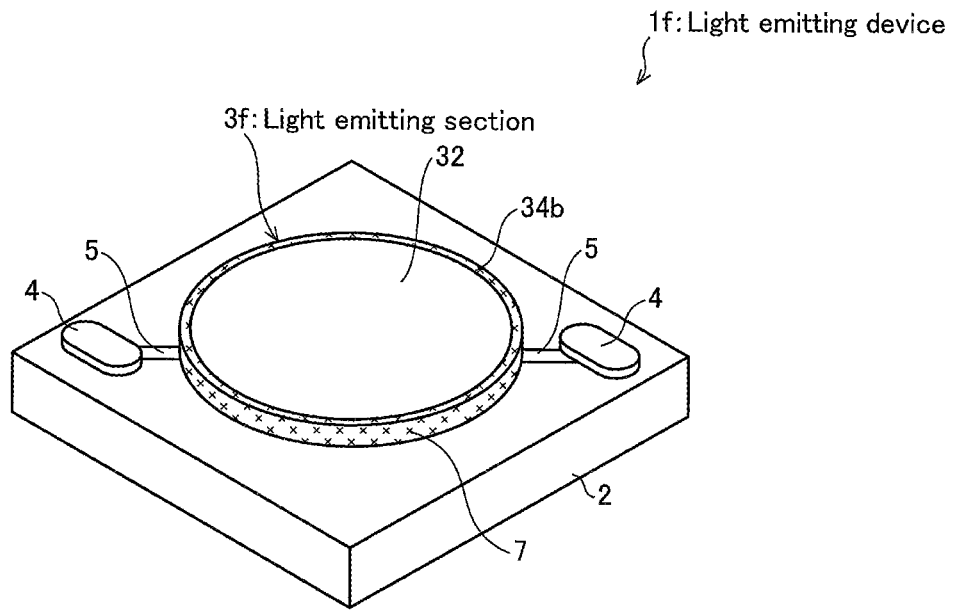
FIG. 12 is a perspective view illustrating an arrangement of a light emitting device of Embodiment 4 of the present invention.
Figure 13:
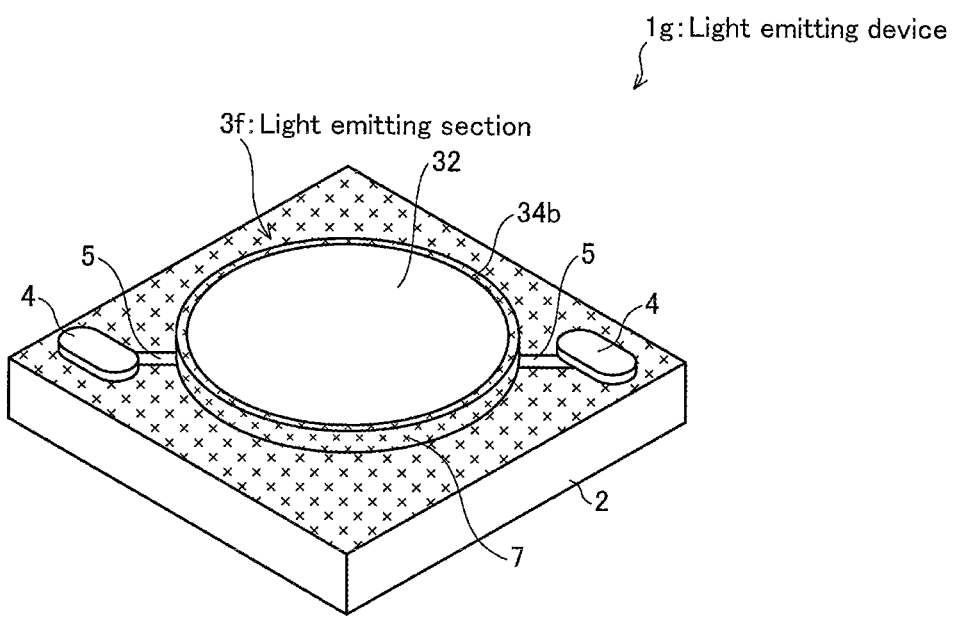
FIG. 13 is a perspective view illustrating an arrangement of a light emitting device of a variation of Embodiment 4 of the present invention.

The following description will discuss Embodiment 4 of the present invention with reference to FIGS. 12 and 13. For convenience, members which have functions identical with those in each of Embodiments 1 through 3 are given identical reference numerals, and will not be described repeatedly.

(Arrangement of Light Emitting Device 1f)

FIG. 12 is a perspective view illustrating an arrangement of a light emitting device 1f of Embodiment 4. The light emitting device 1f includes a substrate 2, a light emitting section 3f, land electrodes 4, and leader lines 5.

The light emitting section 3f includes LED chips (not shown), a sealing resin 32, phosphors (not shown), and a frame body resin 34b. That is, the light emitting section 3f is arranged such that, in the light emitting section 3 of Embodiment 1, the frame body resin 34b is employed instead of the frame body resin 34.

As with the frame body resin 34, the frame body resin 34b functions as a resin dam which defines a region to be sealed with the sealing resin 32. The frame body resin 34b further includes light storing phosphors 7.

The light storing phosphors 7 are mixed in the frame body resin 34b, so that a circumference of the light emitting section 3f can emit light even after the light emitting section 3f is turned off. This also facilitates a production of the light emitting device 1f.

Note that, also in Embodiments 1 through 3, light storing phosphors 7 can be further mixed in the frame body resin 34. In this case, (i) the light storing phosphors 7 to be mixed in the frame body resin 34 and (ii) the light storing phosphors 7 to be mixed in the light storing phosphor layer 6 or the sealing resin 32, can be light storing phosphors of identical types or light storing phosphors of different types.

(Variation)

FIG. 13 is a perspective view illustrating an arrangement of a light emitting device 1g of a variation of Embodiment 4 of the present invention. As with the light emitting device 1f illustrated in FIG. 12, the light emitting device 1g includes a substrate 2, a light emitting section 3f, land electrodes 4, and leader lines 5. Note, however, that the light emitting device 1g differs from the light emitting device 1f in that light storing phosphors 7 are applied to a region on a surface of the substrate 2 in which region no light emitting section 3f is provided.

That is, the light storing phosphors 7 are provided in a region on the substrate 2 in which region no light emitting section 3f is provided.

By further applying the light storing phosphors 7 onto the substrate 2, it is possible to increase a light emitting area of the light emitting device 1g while the light emitting section 3f is being turned off.

Note that, in a case where light storing phosphors 7 are applied onto the substrate 2 by printing, it is possible to employ, as the light storing phosphors 7, $Sr_4Al_{14}O_{25}$:Eu, Dy+$CaAl_2O_4$:Eu,Nd, $CaAl_2O_4$:Eu,Nd, or the like, in addition to the light storing phosphors illustrated in Embodiment 1.

The light storing phosphor 7 to be mixed in the frame body resin 34 and the light storing phosphor 7 to be applied onto the surface of the substrate 2 can be light storing phosphors of identical types or light storing phosphors of different types.

Note that the light storing phosphors 7 can be provided on the substrate 2 by use of a well-known method other than the method of applying them onto the substrate 2.

Embodiment 5

Figure 14:
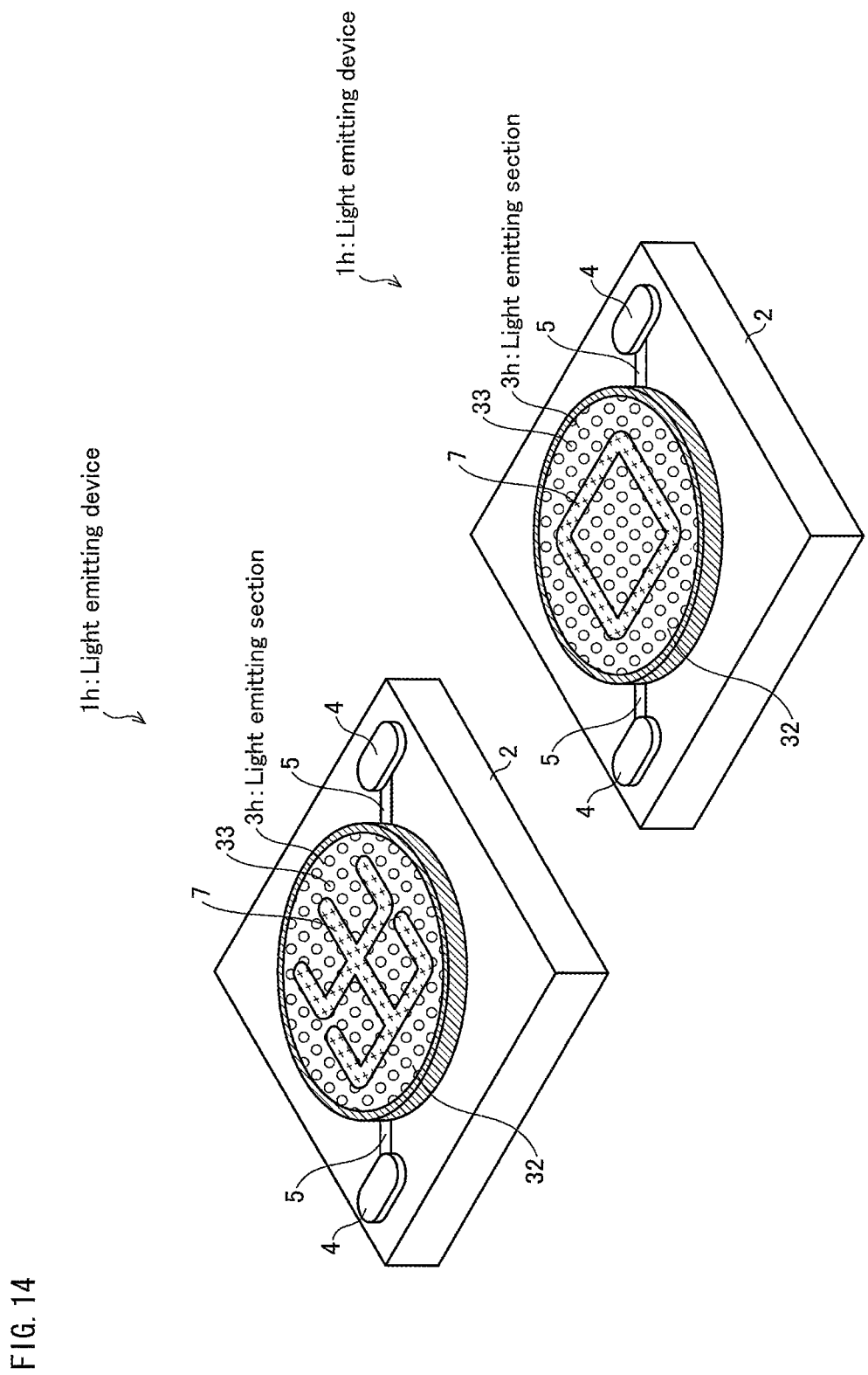
FIG. 14 is a perspective view illustrating arrangements of two light emitting devices of Embodiment 5 of the present invention.
Figure 15:
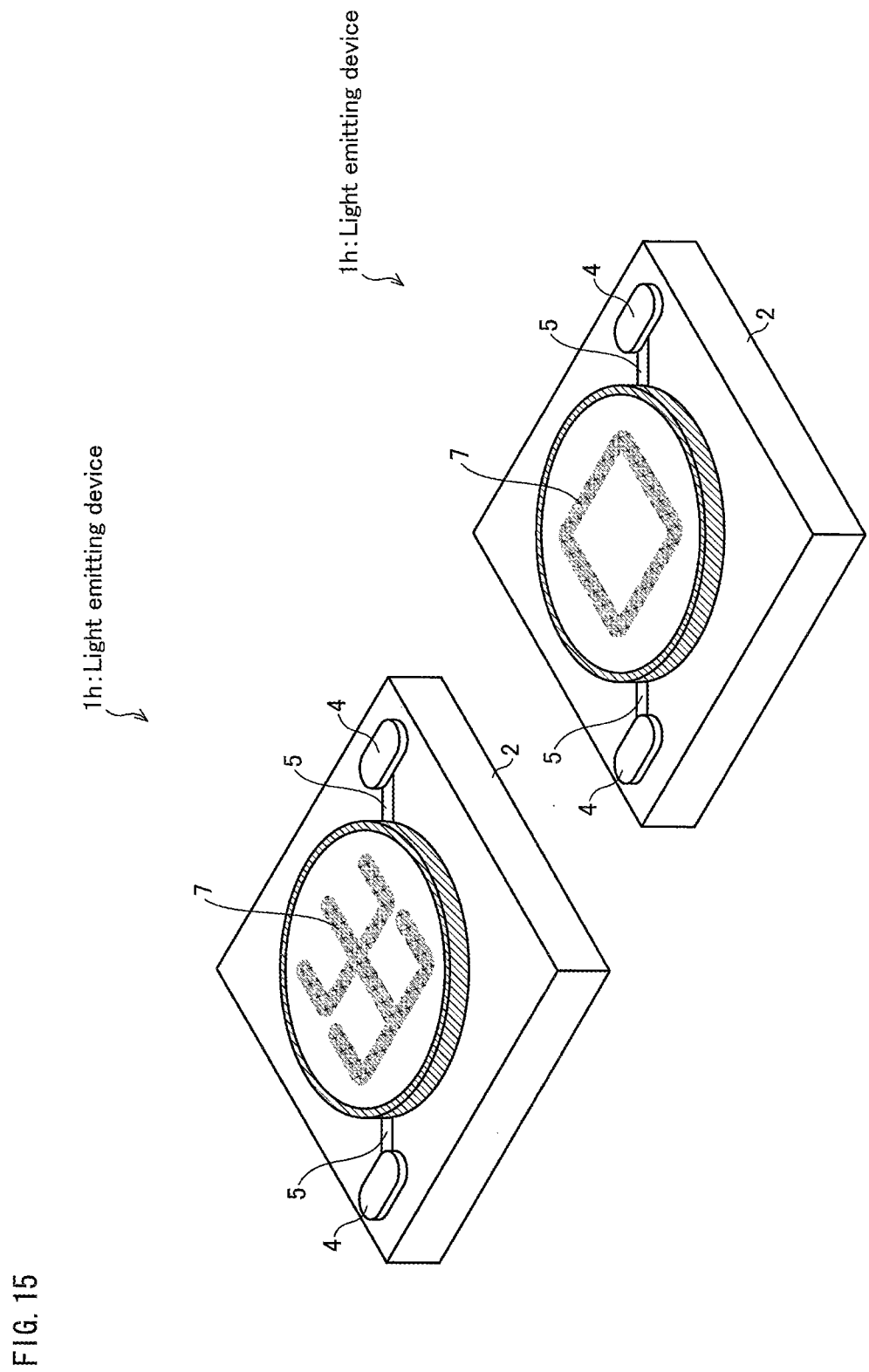
FIG. 15 is a perspective view illustrating the arrangement of the two light emitting device illustrated in FIG. 14 and indicates a state in which a light emitting section is turned off.
Figure 16:
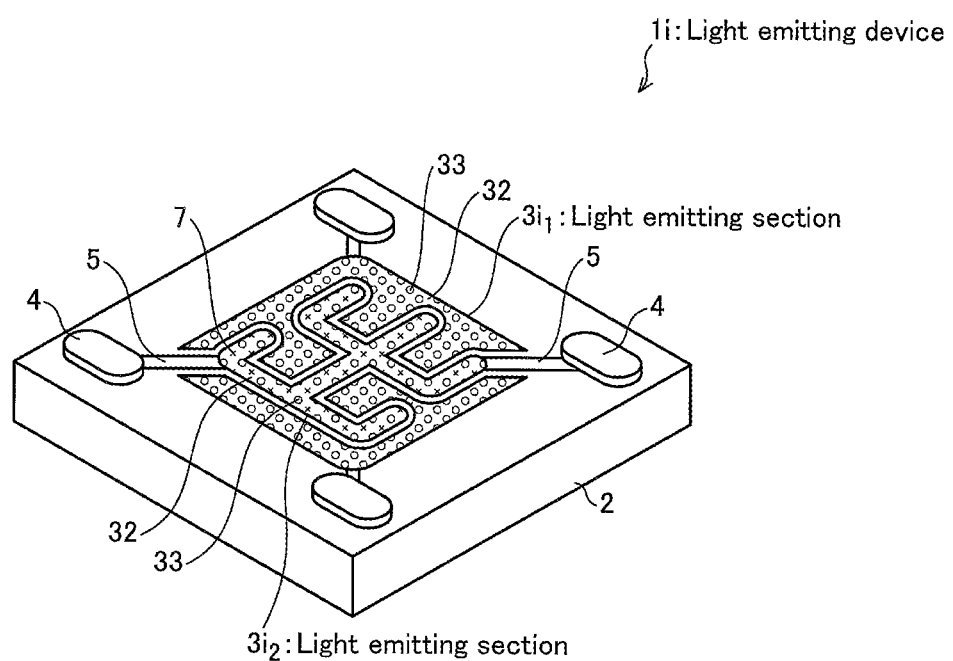
FIG. 16 is a perspective view illustrating an arrangement of a light emitting device of a variation of Embodiment 5 of the present invention.

The following description will discuss Embodiment 5 of the present invention with reference to FIGS. 14 through 16. For convenience, members which have functions identical with those in each of Embodiments 1 through 4 are given identical reference numerals, and will not be described repeatedly.

(Arrangement of Light Emitting Device 1h)

FIG. 14 is a perspective view illustrating arrangements of respective two light emitting devices 1h of Embodiment 5 of the present invention. The light emitting devices 1h each include a substrate 2, a light emitting section 3h, land electrodes 4, and leader lines 5.

The light emitting section 3h includes LED chips (not shown), a sealing resin 32, phosphors 33, a frame body resin 34, and light storing phosphors 7. The LED chips (not shown), the phosphors 33, and the light storing phosphors 7 are sealed with the sealing resin 32.

Note here that light storing phosphors 7 of Embodiment 5 are arranged so as to form a character or a symbol to be displayed by each of the light emitting devices 1h. According to the light emitting device 1h illustrated on a left side of FIG. 14, the light storing phosphors 7 are arranged so as to form a character (kanji) "田". On the other hand, according to the light emitting device 1h illustrated on a right side of FIG. 14, the light storing phosphors 7 are arranged so as to form a character (kanji) "口".

As such, when the light emitting sections 3h are turned off, the two light emitting devices 1h emit light so as to draw the respective characters "田" and "口", i.e., the characters "田口" (an exit) (see FIG. 15). This enhances a function of each of the light emitting devices 1h as an emergency illuminating apparatus. Note that the light storing phosphors 7 can be arranged so as to form a symbol, such as an arrow, which indicates an evacuation route.

Alternatively, the light storing phosphors 7 can be arranged so as to form a diagram or a pattern. In a case where such a diagram or a pattern is displayed by the light storing phosphors 7 after the light emitting device is turned off, the light emitting device can be used as interior illumination.

(Variation)

FIG. 16 is a perspective view illustrating an arrangement of a light emitting device 1i of a variation of Embodiment 5 of the present invention. The light emitting device 1i includes a substrate 2, light emitting sections $3i_1$ and $3i_2$, land electrodes 4, and leader lines 5.

The light emitting section $3i_1$ includes LED chips (not shown), a sealing resin 32, phosphors 33, and a frame body resin (not shown). The light emitting section $3i_2$ further includes light storing phosphors 7, in addition to LED chips (not shown), a sealing resin 32, phosphors 33, and a frame body resin (not shown).

Note here that the light emitting section $3i_2$ is provided so as to draw the character "田". Since the light storing phosphors 7 are mixed in the light emitting section $3i_2$, the light emitting device 1i emits light so that the character "田" is drawn in a case where the LED chips of the light emitting sections $3i_1$ and $3i_2$ are turned off.

By thus arranging the light storing phosphors so as to form a character or a symbol, it is possible to enhance a function of the light emitting device 1i as an emergency illuminating apparatus.

Embodiment 6

Figure 17:
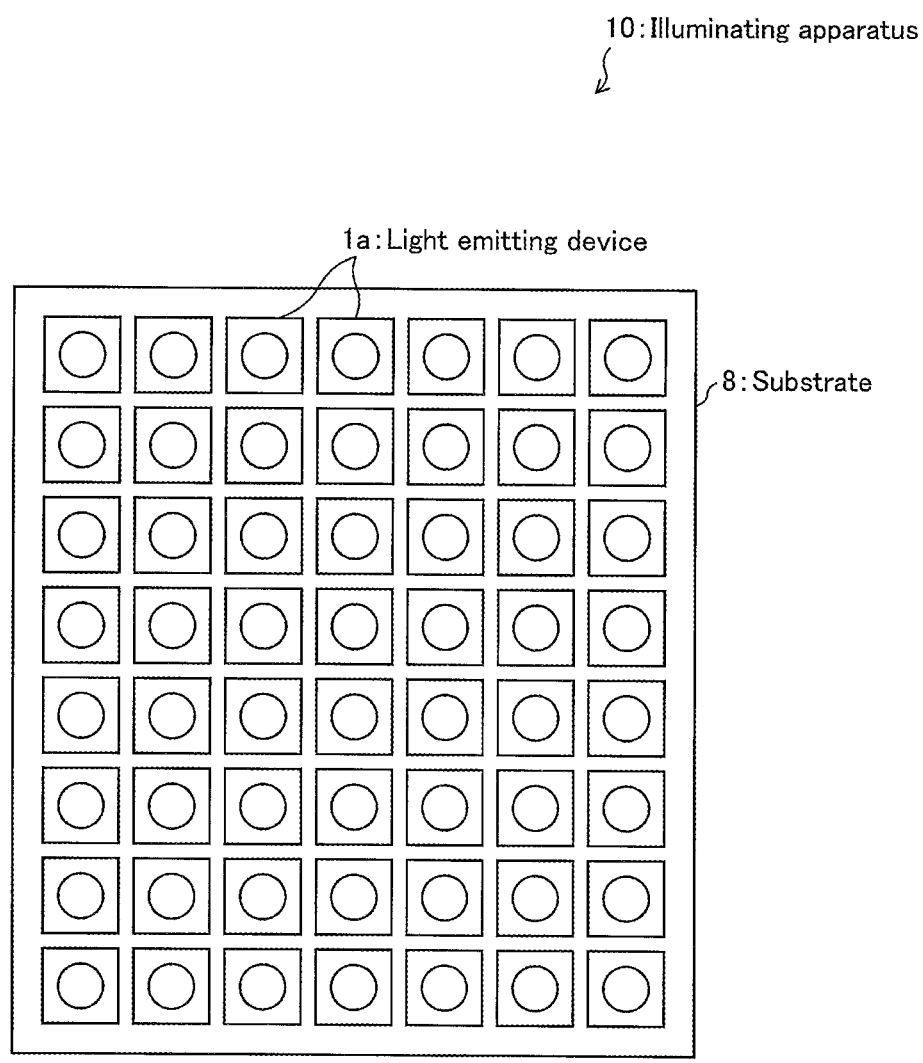
FIG. 17 is a plan view illustrating an arrangement of an illuminating apparatus of Embodiment 6 of the present invention.
Figure 18:
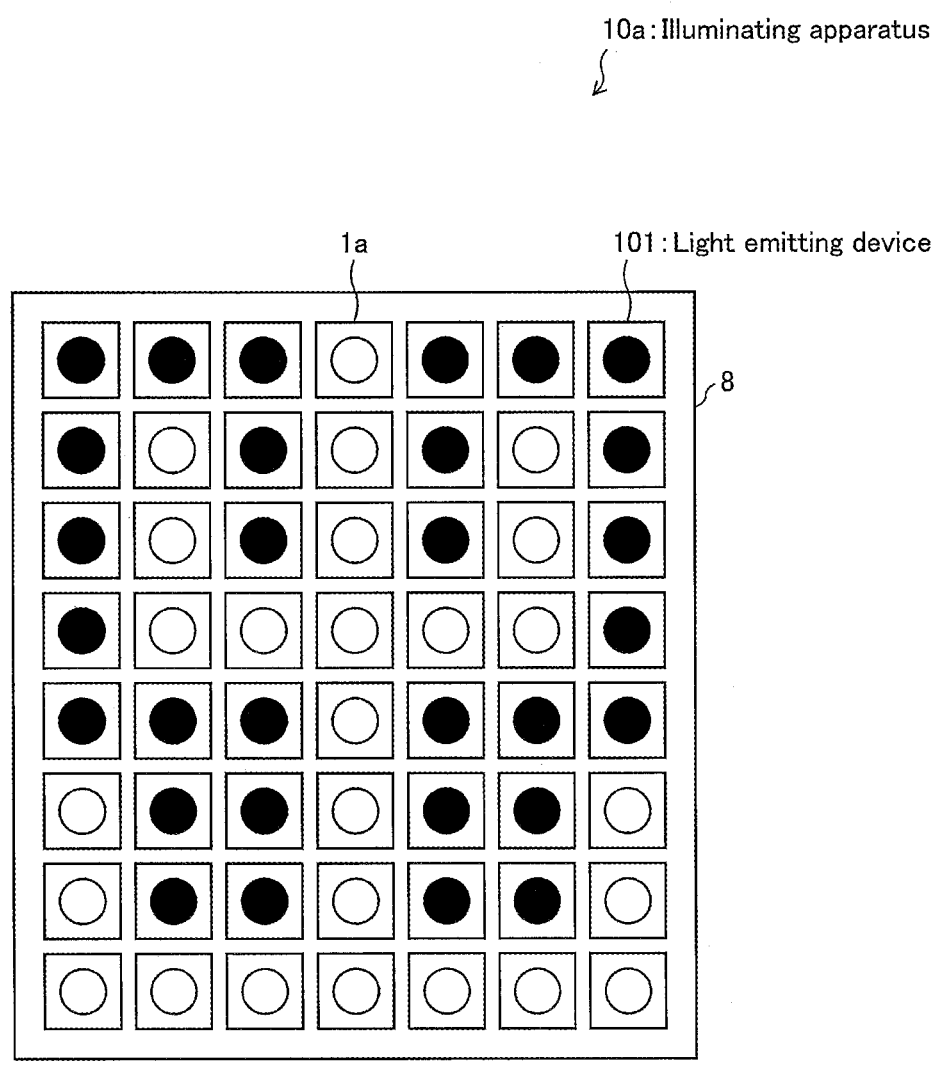
FIG. 18 is a plan view illustrating an arrangement of an illuminating apparatus of a variation of Embodiment 6 of the present invention.

The following description will discuss Embodiment 6 of the present invention with reference to FIGS. 17 and 18. Embodiment 6 will deal with an illuminating apparatus including a plurality of light emitting devices of the present invention. For convenience, members which have functions identical with those in each of Embodiments 1 through 5 are given identical reference numerals, and will not be described repeatedly.

(Example of Illuminating Apparatus)

FIG. 17 is a plan view illustrating an arrangement of an illuminating apparatus 10 of Embodiment 6. The illuminating apparatus 10 is arranged such that a plurality of light emitting devices 1a of Embodiment 2 are two-dimensionally arranged on a substrate 8. This allows the illuminating apparatus 10 to emit light for a while, even in a case where supply of electronic power to the illuminating apparatus 10 is stopped.

FIG. 18 is a plan view illustrating an arrangement of an illuminating apparatus 10a of a variation of Embodiment 6. The illuminating apparatus 10a is arranged such that a plurality of light emitting devices 1a and a plurality of light emitting devices 101 are two-dimensionally arranged on a substrate 8. The light emitting devices 101 are each a non-light storing light emitting device including no light storing phosphor.

According to the illuminating apparatus 10a, the light emitting devices 1a each having light storing phosphors are arranged so as to form the character "田". As such, in a case where supply of electric power to the illuminating apparatus 10a is stopped, the illuminating apparatus 10a emits light so as to display the character "田" (see FIG. 18).

Note that the light emitting device having the light storing phosphors is not limited to the light emitting device 1a. Alternatively, each of the light emitting devices 1 and 1b through 1g can be employed. Moreover, the illuminating apparatus is arranged such that only light emitting devices each having light storing phosphors are arranged so as to form a character or a symbol.

By arranging the light emitting devices of the present invention so as to form a character or a symbol, it is possible to enhance a function of the illuminating apparatus 10a as an emergency illuminating apparatus.

SUMMARY OF EMBODIMENTS

The above descriptions have discussed various configurations in which light storing phosphors are included in a light emitting device having a planar light emitting section provided on a substrate. Note, however, that a method of including light storing phosphors in the light emitting device is not limited to the description of the embodiments above. That is, a light emitting device including a planar light emitting section provided on a substrate, wherein light storing phosphors are provided on or above at least a part of the substrate, or in other words, a light emitting device including a substrate on which a light emitting part and a part including light storing phosphors are provided is encompassed in the technical scope of the present invention.

For example, light storing phosphors 7 can be included in an adhesive (compound) via which back surfaces of the LED chips 31 are to be adhered to a front surface of the substrate 2. Since light transmits a back surface of a substrate that the LED chips 31 includes, light emitted from the LED chips 31 is partially stored in the light storing phosphors 7 in a case where the light storing phosphors 7 are included in the adhesive for mounting the LED chips 31.

CONCLUSION

As described above, a light emitting device of one aspect of the present invention is a light emitting device including: a light emitting section provided on a substrate, light storing phosphors being provided on or above at least a part of the substrate.

With the arrangement, since the light storing phosphors are provided on the at least a part of the substrate, even in a case where the light emitting section stops emitting light, the light storing phosphors emit light for a while. As such, the light emitting device can maintain a function as a light source. It is therefore possible to provide a planar light emitting device having a light storage function.

The light emitting device of one aspect of the present invention is preferably arranged such that the light emitting section includes (i) a plurality of light emitting elements provided on the substrate and (ii) a sealing resin with which the plurality of light emitting elements are sealed.

A light emitting device of one aspect of the present invention is preferably arranged to further include: a frame body resin which is provided on an outer circumference of the sealing resin and defines a region which is sealed with the sealing resin, the frame body resin including the light storing phosphors.

With the arrangement, the light storing phosphors are mixed in the frame body resin, so that a circumference of the light emitting section can emit light even after the light emitting section is turned off. This also facilitates a production of the light emitting device.

The light emitting device of one aspect of the present invention is preferably arranged such that the light storing phosphors are applied onto the substrate.

The light emitting device of one aspect of the present invention is preferably arranged such that the light storing phosphors are provided on the substrate.

With the arrangement, it is possible to increase a light emitting area of the light emitting device while the light emitting section is being turned off.

The light emitting device of one aspect of the present invention is preferably arranged such that at least one light storing phosphor layer, in which the light storing phosphors are sealed, is provided on a surface of the light emitting section.

The light emitting device of one aspect of the present invention is preferably arranged such that the light storing phosphors and the light emitting elements are together sealed with the sealing resin.

The light emitting device of one aspect of the present invention is preferably arranged such that the light storing phosphors are disproportionately distributed on a side of the substrate rather than a surface side of the light emitting section.

With the arrangement, the light storing phosphors are disproportionately distributed on the side of the substrate side rather than the surface side of the light emitting section. Accordingly, the light storing phosphors hardly block light emitted from the light emitting elements while the light emitting section is normally being turned on. This suppresses a reduction in luminous efficiency of the light emitting device while the light emitting device is normally being turned on.

The light emitting device of one aspect of the present invention is preferably arranged such that a plurality of light storing phosphor layers, in each of which the light storing phosphors are sealed, are provided on the substrate; and at least one of the plurality of light storing phosphor layers is surrounded by the sealing resin.

The light emitting device of one aspect of the present invention is preferably arranged such that the plurality of light storing phosphor layers are in contact with the sealing resin.

The light emitting device of one aspect of the present invention is preferably arranged such that at least one of the plurality of light storing phosphor layers is separated from the sealing resin.

With the arrangement, it is possible that the light storing phosphor layer is formed after the light emitting section is formed. Alternatively, it is possible that the light emitting section is formed after the light storing phosphor layer is formed. This increases a degree of freedom in a production process of the light emitting device.

The light emitting device of one aspect of the present invention is preferably arranged such that the light storing phosphors are arranged so as to form a character or a symbol.

With the arrangement, it is possible to enhance a function of the light emitting device as an emergency illuminating apparatus.

The light emitting device of one aspect of the present invention is preferably arranged such that the light storing phosphors are sealed with a thixotropic resin.

With the arrangement, it is possible to facilitate providing the light storing phosphor layer and to make it difficult for the light storing phosphor layer to lose shape.

An illuminating apparatus of one aspect of the present invention includes a plurality of light emitting devices.

The illuminating apparatus of one aspect of the present invention is preferably arranged such that the plurality of light emitting devices are two-dimensionally arranged.

An illuminating apparatus of one aspect of the present invention is preferably arranged to further include: a non-light storing light emitting device which includes a planar light emitting section provided on a substrate and includes no light storing phosphor, the non-light storing light emitting device and the plurality of light emitting devices being two-dimensionally arranged.

The illuminating apparatus of one aspect of the present invention is arranged such that the plurality of light emitting devices are arranged so as to form a character or a symbol.

With the arrangement, it is possible to enhance a function of the illuminating apparatus as an emergency illuminating apparatus.

The present invention is not limited to the description of the embodiments above, but may be altered by a skilled person in the art within the scope of the claims. An embodiment based on a proper combination of technical means disclosed in different embodiments is encompassed in the technical scope of the present invention.

Note that in an embodiment derived from a proper combination of technical means disclosed in each embodiment or in different embodiments, one (1) type of light storing phosphors or a plurality of types of light storing phosphors can be employed.

INDUSTRIAL APPLICABILITY

The present invention is particularly applicable to an emergency illuminating apparatus.

REFERENCE SIGNS LIST

1: Light emitting device
1a: Light emitting device
1b: Light emitting device
1c: Light emitting device
1d: Light emitting device
1e: Light emitting device
1f: Light emitting device
1g: Light emitting device 1*h*: Light emitting device
1*i*: Light emitting device
2: Substrate
2*a*: Concave part
3: Light emitting section
3*a*: Light emitting section
3*b*: Light emitting section
3*c*: Light emitting section
3*d*: Light emitting section
3*e*: Light emitting section
3*f*: Light emitting section
3*h*: Light emitting section
$3i_1$: Light emitting section
$3i_2$: Light emitting section
4: Land electrode
5: Leader line
6: Light storing phosphor layer
6*c*: Light storing phosphor layer
6*d*: Light storing phosphor layer
6*e*: Light storing phosphor layer
7: Light storing phosphor
8: Substrate
10: Illuminating apparatus
10*a*: Illuminating apparatus
31: LED chip (light emitting element)
32: Sealing resin
33: Phosphor
101: Light emitting device

The invention claimed is:

1. A light emitting device comprising:
a light emitting section provided on a substrate,
the light emitting section including (i) a plurality of light emitting elements provided on the substrate and (ii) a sealing resin with which the plurality of light emitting elements are sealed,
the sealing resin including (a) phosphors each having a relatively short afterglow time and (b) light storing phosphors each having an afterglow time longer than that of each of the phosphors,
the phosphors and the light storing phosphors being not mixed with each other in the sealing resin but being provided in respective different regions.

2. The light emitting device as set forth in claim 1, wherein the light storing phosphors are arranged so as to form a character or a symbol.

3. An illuminating apparatus comprising:
a plurality of light emitting devices recited in claim 1.

4. The illuminating apparatus as set forth in claim 3, wherein the plurality of light emitting devices are two-dimensionally arranged.

5. An illuminating apparatus as set forth in claim 4, further comprising:
a non-light storing light emitting device which includes a planar light emitting section provided on a substrate and includes no light storing phosphor,
the non-light storing light emitting device and the plurality of light emitting devices being two-dimensionally arranged.

6. The illuminating apparatus as set forth in claim 4, wherein the plurality of light emitting devices are arranged so as to form a character or a symbol.

7. The light emitting device as set forth in claim 1, wherein the light storing phosphors are arranged in a bottom part of the sealing resin.

8. The light emitting device as set forth in claim 1, wherein the light storing phosphors are provided in a center part of the light emitting section.

9. A light emitting device comprising:
a light emitting section provided on a substrate, the light emitting section including (i) a plurality of light emitting elements provided on the substrate (ii) a sealing resin with which the plurality of light emitting elements are sealed, and (iii) a light storing phosphor layer,
among phosphors and light storing phosphors, only the phosphors being mixed in the sealing resin and only the light storing phosphors being mixed in the light storing phosphor layer, the phosphors each having a relatively short afterglow time, the light storing phosphors each having an afterglow time longer than that of each of the phosphors,
the light storing phosphor layer being surrounded by the sealing resin, the light storing phosphor layer not overlapping with the sealing resin when viewed from above.

10. The light emitting device as set forth in claim 9, wherein the plurality of light storing phosphor layers are in contact with the sealing resin.

11. The light emitting device as set forth in claim 9, wherein at least one of the plurality of light storing phosphor layers is separated from the sealing resin.

12. The light emitting device as set forth in claim 9, wherein the light storing phosphors are sealed with a thixotropic resin.

13. A light emitting device comprising:
a light emitting section provided on a substrate,
the light emitting section including (i) a plurality of light emitting elements provided on the substrate, (ii) a sealing resin with which the plurality of light emitting elements are sealed, and (iii) a frame body resin which is provided on an outer circumference of the sealing resin and defines a region which is sealed with the sealing resin,
among phosphors and light storing phosphors, only the phosphors being mixed in the sealing resin and only the light storing phosphors being mixed in the frame body resin, the phosphors each having a relatively short afterglow time, the light storing phosphors each having an afterglow time longer than that of each of the phosphors.

14. A light emitting device comprising:
a light emitting section provided on a substrate,
the light emitting section including (i) a plurality of light emitting elements provided on the substrate and (ii) a sealing resin with which the plurality of light emitting elements are sealed,
the sealing resin including (a) phosphors each having a relatively short afterglow time and (b) light storing phosphors each having an afterglow longer than that of each of the phosphors,
the light storing phosphors are disproportionately distributed on a side of the substrate rather than a surface side of the light emitting section.

* * * * *